(12) United States Patent
Li et al.

(10) Patent No.: US 12,476,650 B2
(45) Date of Patent: Nov. 18, 2025

(54) METHOD FOR CALIBRATING ANALOG-TO-DIGITAL CONVERTER

(71) Applicant: CHINA ELECTRONICS TECHNOLOGY GROUP CORPORATION NO. 24 RESEARCH INSTITUTE, Chongqing (CN)

(72) Inventors: Ting Li, Chongqing (CN); Ruzhang Li, Chongqing (CN); Yong Zhang, Chongqing (CN); Yabo Ni, Chongqing (CN); Chao Chen, Chongqing (CN); Liang Li, Chongqing (CN); Huaiqiang Yu, Chongqing (CN); Dongbing Fu, Chongqing (CN); Jianan Wang, Chongqing (CN); Guangbing Chen, Chongqing (CN)

(73) Assignee: CHINA ELECTRONICS TECHNOLOGY GROUP CORPORATION NO. 24 RESEARCH INSTITUTE, Chongqing (CN)

( * ) Notice: Subject to any disclaimer, the term of this patent is extended or adjusted under 35 U.S.C. 154(b) by 130 days.

(21) Appl. No.: 18/399,607

(22) Filed: Dec. 28, 2023

(65) Prior Publication Data
US 2024/0223202 A1 Jul. 4, 2024

Related U.S. Application Data

(63) Continuation of application No. PCT/CN2023/096785, filed on May 29, 2023.

(30) Foreign Application Priority Data

Dec. 31, 2022 (CN) .......................... 202211737070.6

(51) Int. Cl.
*H03M 1/10* (2006.01)

(52) U.S. Cl.
CPC ................................. *H03M 1/1057* (2013.01)

(58) Field of Classification Search
CPC ........ H03M 1/57; H03M 1/76; H03M 1/1057; H03M 1/1076
See application file for complete search history.

(56) References Cited

U.S. PATENT DOCUMENTS 7,522,077 B1 * 4/2009 Itkin ..................... H03M 1/109
341/120
8,344,920 B1 * 1/2013 Hernes ................ H03M 1/1057
375/345

(Continued)

FOREIGN PATENT DOCUMENTS

CN 103929178 A 7/2014
CN 110336561 A 10/2019

(Continued)

*Primary Examiner* — Lam T Mai (57) ABSTRACT

A method for calibrating an analog-to-digital converter includes the following steps: conducting an initial performance test and judgement on the analog-to-digital converter; if the initial performance test succeeds, performing a pre-trimming and judgement on the analog-to-digital converter; if the pre-trimming succeeds, performing an error extraction on the analog-to-digital converter, obtaining errors of conversion stages of the analog-to-digital converter; performing an error soft trimming and test on the analog-to-digital converter according to the errors of the conversion stages; and if the error soft trimming and test of the analog-to-digital converter succeed, performing an error hard trimming and test on the analog-to-digital converter according to the errors of the conversion stages.

6 Claims, 3 Drawing Sheets

(56) References Cited

U.S. PATENT DOCUMENTS

| | | | | |
|---|---|---|---|---|
| 8,344,927 | B2* | 1/2013 | Jeon | H03M 1/1019 |
| | | | | 327/551 |
| 8,497,794 | B2* | 7/2013 | Etou | H03M 1/0604 |
| | | | | 341/157 |
| 2006/0227026 | A1* | 10/2006 | Kadota | H03M 1/1038 |
| | | | | 341/120 |
| 2009/0189796 | A1* | 7/2009 | Chen | H03M 1/1057 |
| | | | | 341/120 |
| 2009/0243900 | A1* | 10/2009 | Kawahito | H03M 1/144 |
| | | | | 341/172 |
| 2012/0182166 | A1 | 7/2012 | Haneda | |
| 2015/0116140 | A1* | 4/2015 | Ide | H03M 1/442 |
| | | | | 341/122 |
| 2016/0182073 | A1* | 6/2016 | Speir | H03M 1/121 |
| | | | | 341/120 |
| 2022/0321136 | A1* | 10/2022 | Li | H03M 1/1014 |

FOREIGN PATENT DOCUMENTS

| | | |
|---|---|---|
| CN | 113114247 A | 7/2021 |
| CN | 115940951 A | 4/2023 |

* cited by examiner

METHOD FOR CALIBRATING ANALOG-TO-DIGITAL CONVERTER

CROSS REFERENCE TO RELATED APPLICATION

The present application is a continuation application of PCT Application No. PCT/CN2023/096785, filed on May 29, 2023, which claims the benefit of priority to a Chinese Patent Application number CN202211737070.6, filed on Dec. 31, 2022, the disclosure of the above application is hereby incorporated by reference in its entirety for all purposes.

TECHNICAL FIELD

The disclosure relates to the field of integrated circuit technologies, and in particular, to a method for calibrating an analog-to-digital converter.

BACKGROUND

An analog-to-digital converter is an electronic component that converts an analog signal into a digital signal, whose quality of signal collection and conversion depends on the speed and precision thereof. With the development of information technology, the requirement for signal collection and conversion becomes increasingly high, and a high-speed and high-precision analog-to-digital converter is a hotspot required by an integrated system. The advancement of a manufacturing process leads to an increase in a speed, in the meantime also causes more gain errors due to insufficient gains. The speed of the analog-to-digital converter is increased, but the precision thereof is decreased at the same time, thereby reducing the signal-to-noise ratio and linearity thereof. To resolve these problems, error extraction and calibration need to be performed on a plurality of conversion stages with insufficient precision in the converter. In view of these new problems, multi-stage and multi-error tests and calibration performed in the high-speed and high-precision converter by using conventional error testing and calibration methods under advanced process conditions can no longer satisfy application requirements.
  (1) Conventional testing and error extraction methods usually can be used to extract the error of one initial conversion stage only, and cannot be used to extract errors of a plurality of conversion stages. Therefore, these methods are not applicable to a case in which errors occur at a plurality of conversion stages.
  (2) The conventional error extraction method is usually used to extract only a weight mismatch error of a converter, and is not applicable to the extraction of a gain error caused by an insufficient gain.
  (3) In a conventional error extraction method based on an integral nonlinear (INL) error, sample points that need to be collected increase exponentially with improvement of the precision of the converter, causing relatively low efficiency of testing and calibration.

Therefore, currently, a solution for testing and calibrating an analog-to-digital converter is urgently needed to resolve the problems that a conventional error testing and calibration method cannot perform multi-stage and multi-error calibration and efficiency of testing and calibration is low.

SUMMARY

In view of the foregoing disadvantages of the conventional technology, an objective of the disclosure is to provide a method for calibrating an analog-to-digital converter, so as to resolve problems that a conventional error testing and calibration method cannot perform multi-stage and multi-error calibration and the efficiency of testing and calibration is low.

To achieve the foregoing objective and other related objectives, the disclosure provides the following technical solutions:

A method for calibrating an analog-to-digital converter includes the following steps:
  Conducting an initial performance test and judgement on an analog-to-digital converter;
    if the initial performance testing of the analog-to-digital converter succeeds, performing a pre-trimming and judgement on the analog-to-digital converter;
    if the pre-trimming of the analog-to-digital converter succeeds, performing an error extraction on the analog-to-digital converter to obtain the errors of conversion stages thereof;
  performing error soft trimming and testing on the analog-to-digital converter according to the errors of the conversion stages; and
    if the error soft trimming and testing thereof succeed, performing an error hard trimming and testing on the analog-to-digital converter according to the errors of the conversion stages.

Optionally, before the initial performance testing and judgement on the analog-to-digital converter, the method for calibrating the analog-to-digital converter further includes:
  configuring an input signal according to an input range of the analog-to-digital converter.

Optionally, the maximum value of the input signal is greater than the maximum comparator threshold in the analog-to-digital converter, and the minimum value of the input signal is less than the minimum comparator threshold in the analog-to-digital converter.

Optionally, the step of conducting the initial performance test and judgement on the analog-to-digital converter includes:
  configuring a handshake signal;
  performing an initial performance test on the analog-to-digital converter and collect initial testing output data of the analog-to-digital converter;
  judging whether the initial testing output data is/are normal;
  if the initial testing output data is/are normal, calculating a characteristic parameter of the analog-to-digital converter according to the initial testing output data; and
  judging whether the characteristic parameter reaches a threshold, wherein
    if the characteristic parameter reaches the threshold, the initial performance test of the analog-to-digital converter succeeds.

Optionally, the analog-to-digital converter includes N conversion stages, and the step of performing the pre-trimming and judgement on the analog-to-digital converter includes:
  extracting weight errors of previous M conversion stages under a constraint of a minimum mean square error;
  extracting gain errors of the previous M conversion stages under the constraint of the minimum mean square error;
  calibrating the analog-to-digital converter according to the weight errors and the gain errors of the previous M conversion stages;
  conducting a performance test on the calibrated analog-to-digital converter and collect a test output of the analog-to-digital converter; and judging whether the pre-trimming of the analog-to-digital converter succeeds according to the test output thereof, wherein N is an integer greater than or equal to 2, and M is an integer of 1 to N-1.

Optionally, the step of performing the error extraction on the analog-to-digital converter to obtain errors of the conversion stages of the analog-to-digital converter includes:

for each conversion stage, configuring the input signal and an output mode according to a quantity of the errors that need to be tested;

for each conversion stage, performing an analog-to-digital conversion by using the analog-to-digital converter according to the configured input signal and the configured output mode, collecting the output data of the analog-to-digital converter, restoring the output data according to a characteristic of the input signal, and obtaining ideal output data; and for each conversion stage, extracting errors of the conversion stage from a difference between the output data and the ideal output data by using an adaptive parameter extraction method.

Optionally, the errors include a weight error, a gain error, and a jitter error; and for the conversion stages, the weight error and the gain error of each conversion stage are successively extracted from a post conversion stage of the conversion stages to a previous conversion stage thereof.

Optionally, for the conversion stages, there is no order requirement for extracting the jitter errors, but the jitter errors are extracted after the weight errors and the gain errors are extracted.

Optionally, when the weight error and the gain error need to be tested and extracted, an amplitude of the input signal of each stage and a threshold voltage of comparators at each stage are configured, and output results of the comparators at each stage are sent; and when the jitter error needs to be tested and extracted, random codes and output codes of correspondingly needed conversion stages are sent.

Optionally, the step of performing the error soft trimming and test on the analog-to-digital converter according to the errors of the conversion stages includes:

sending the errors of all the conversion stages to a temporary storage register of the analog-to-digital converter for storage;

calibrating the analog-to-digital converter through the errors stored in the temporary storage register, and completing the error soft trimming of the analog-to-digital converter;

performing the analog-to-digital conversion test on the analog-to-digital converter after the error soft trimming, obtaining soft trimming testing output data, and calculating a characteristic parameter of the analog-to-digital converter after the error soft trimming according to the soft trimming testing output data; and judging whether the error soft trimming thereof succeeds according to the characteristic parameter of the analog-to-digital converter after the error soft trimming.

Optionally, the step of performing the error hard trimming and test on the analog-to-digital converter according to the errors of the conversion stages includes:

writing the errors of the conversion stages stored in the temporary storage register into an internal built-in memory of the analog-to-digital converter for permanent storage;

automatically reading the errors stored in the internal built-in memory during each power-on, and calibrating the analog-to-digital converter through the errors, and completing the error hard trimming of the analog-to-digital converter;

performing the analog-to-digital conversion test on the analog-to-digital converter after the error hard trimming, obtaining hard trimming testing output data, and calculating a characteristic parameter of the analog-to-digital converter after the error hard trimming according to the hard trimming testing output data; and judging, according to the characteristic parameter of the analog-to-digital converter after the error hard trimming, whether the error hard trimming thereof succeeds.

As described above, the method for calibrating the analog-to-digital converter provided in the disclosure brings at least the following beneficial effects:

The initial performance test and judgement can be conducted to eliminate a circuit with an excessively low initial performance that is caused by a process deviation, so as to avoid a waste of resources caused when such type of circuit continues to enter subsequent testing and trimming steps but no qualified product is achieved, thereby improving the test screening efficiency thereof. The pre-trimming step is additionally performed to roughly pre-estimate the final trimming performance evaluate the feasibility of the trimming and form a second screening, so as to avoid a waste of resources caused when a circuit with an excessively large deviation continues to enter subsequent testing and trimming steps but no qualified product is formed, thereby further improving the test screening efficiency thereof. When the error extraction is performed on the analog-to-digital converter, errors of the conversion stages thereof can be obtained through extraction, thereby implementing multi-stage and multi-error extraction of the analog-to-digital converter. A soft trimming is performed to confirm a trimming effect thereof, and then a hard trimming is performed to solidify error compensation information, thereby avoiding a trimming mistake and increasing a trimming yield rate. As a whole, the calibration method is a digital calibration method, and achieves a higher precision of error calibration than an analog calibration method.

DESCRIPTION OF EMBODIMENTS

As mentioned above in the BACKGROUND section, the inventor finds, through research, that with the high-speed and high-precision development of an analog-to-digital converter, the advancement of a manufacturing process leads to an increase in the speed thereof, but causes more gain errors due to insufficient gains, whereby the speed of the analog-to-digital converter is increased and in the meantime the precision of the analog-to-digital converter is decreased, thereby reducing the signal-to-noise ratio and linearity thereof. To resolve these problems, error extraction and calibration need to be performed on a plurality of conversion stages with insufficient precision in the converter. In view of these new problems, conventional error test and calibration methods under advanced process conditions can no longer satisfy application requirements with regard to multi-stage and multi-error test and calibration performed in the high-speed and high-precision converter.

(1) Conventional test and error extraction methods usually can be used to extract the error of one initial conversion stage only, and cannot be used to extract errors of a plurality of conversion stages. Therefore, these methods are not applicable to a case in which errors occur at a plurality of conversion stages.

(2) The conventional error extraction method is usually used to extract only a weight mismatch error of a converter, and is not applicable to extraction of a gain error caused by an insufficient gain.

(3) In a conventional error extraction method according to an integral nonlinear (INL) error, sample points that need to be collected increase exponentially with the improvement of the precision of the converter, causing relatively low efficiency of test and calibration thereof.

On this basis, the disclosure provides a solution for testing and calibrating an analog-to-digital converter. Before a formal test and calibration, an initial performance test step and a pre-trimming step are added, so as to eliminate a circuit with an excessively low initial performance that is caused by a process deviation, and to avoid a waste of resources caused when such type of circuit continues to enter subsequent testing and trimming steps while no qualified product is formed, thereby improving the test screening efficiency thereof. According to different input and output requirements of errors of stages, the input signals, the threshold voltages of comparators and the output modes are flexibly configured to implement multi-stage and multi-error extraction of the analog-to-digital converter. A soft trimming is performed to confirm a trimming effect, and then a hard trimming is performed to solidify error compensation information, thereby avoiding a trimming mistake and increasing a trimming yield rate. An adaptive parameter extraction method is used to extract an error and reduce a quantity of samples, thereby reducing a calculation amount of the parameter extraction and improving the efficiency of the test and calibration.

The following describes some implementations of the disclosure by using some specific examples. A person skilled in the art can easily understand other advantages and effects of the disclosure based on the content disclosed in this specification. The disclosure can be further implemented or applied in some other different specific implementations. Various details in this specification can also be modified or altered based on different viewpoints and applications without departing from the spirit of the disclosure.

Figure 1:
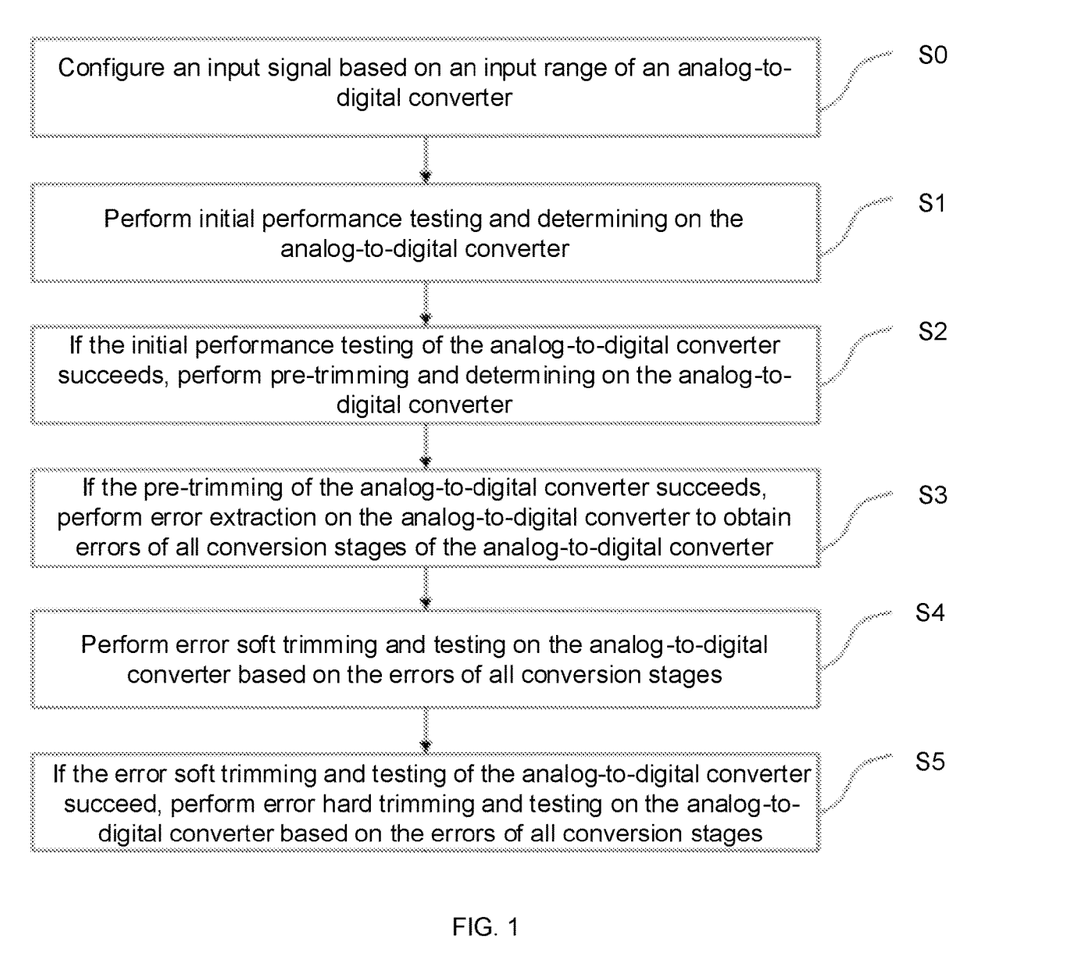
FIG. 1 is a schematic diagram of steps of a method for calibrating an analog-to-digital converter according to the disclosure.
Figure 2:
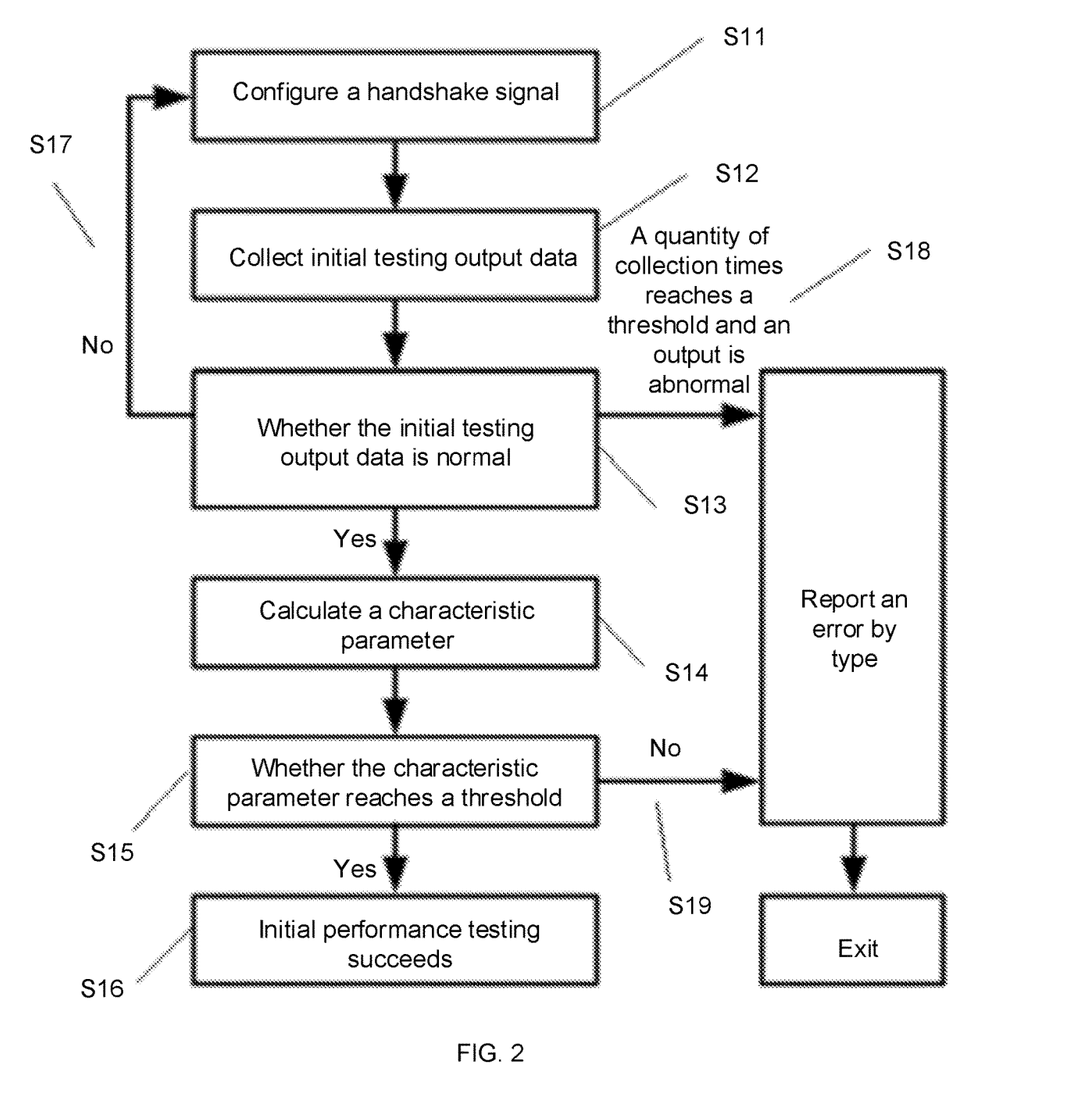
FIG. 2 is a flowchart of performing an initial performance test and judgement on an analog-to-digital converter according to an optional embodiment of the disclosure.
Figure 3:
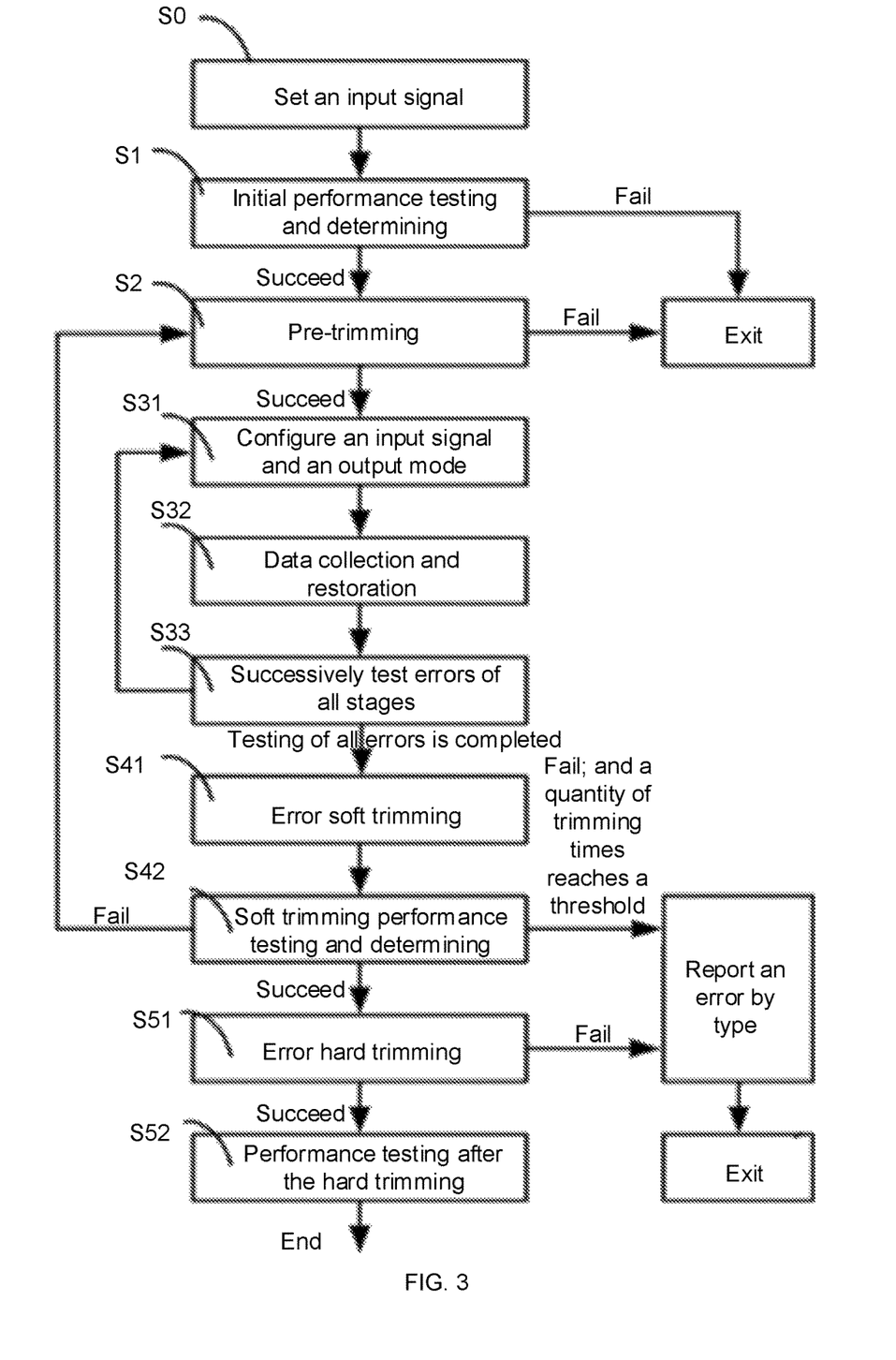
FIG. 3 is a flowchart of a method for calibrating an analog-to-digital converter according to an optional embodiment of the disclosure.

References are made to FIG. 1 to FIG. 3. It should be noted that, the illustrations provided in some embodiments merely describe the basic concept of the disclosure by using examples. Although the drawings show only components related to the disclosure, and are not drawn based on a quantity of components, a shape of a component, and a size of a component during actual implementation, a shape, a quantity, and a scale of the components may be arbitrarily changed during actual implementation, and a component layout form may be more complex. The structure, scale, size, and the like shown in the drawings of this specification are merely used to cooperate with the content disclosed in the specification for a person skilled in the art to understand and read, and are not restrictions for limiting the implementation of the disclosure, and therefore have no technically substantial significance. Any modification of the structure, change of a proportional relationship or adjustment of the size shall still fall within the scope that can be covered by the technical content disclosed in the disclosure, provided that they do not affect the efficacy that can be generated by the disclosure and the purpose that can be achieved by the disclosure.

As shown in FIG. 1, the disclosure provides a method for calibrating an analog-to-digital converter, including the following steps:

S1: Conduct an initial performance test and judgement on an analog-to-digital converter;

S2: If the initial performance test of the analog-to-digital converter succeeds, perform a pre-trimming and judgement on the analog-to-digital converter;

S3: If the pre-trimming of the analog-to-digital converter succeeds, perform an error extraction on the analog-to-digital converter and obtain errors of all conversion stages thereof;

S4: Perform an error soft trimming and test on the analog-to-digital converter according to the errors of conversion stages; and S5: If the error soft trimming and test of the analog-to-digital converter succeed, perform an error hard trimming and test on the analog-to-digital converter according to the errors of the conversion stages.

In detail, as shown in FIG. 1, before the conducting the initial performance test and judgement on the analog-to-digital converter, the method for calibrating the analog-to-digital converter further includes the following step:

S0: Configure an input signal according to an input range of the analog-to-digital converter.

In more detail, in step S0, the maximum value of the input signal is greater than the maximum comparator threshold in the analog-to-digital converter, and the minimum value of the input signal is less than the minimum comparator threshold in the analog-to-digital converter. For example, an input signal that is 1 dB less than a full amplitude is usually input.

In detail, as shown in FIG. 2, in an optional embodiment of the disclosure, step S1 of conducting an initial performance test and judgement on the analog-to-digital converter further includes:

S11: Configure a handshake signal;

S12: Conduct an initial performance test on the analog-to-digital converter and collect initial testing output data thereof;

S13: Judge whether the initial testing output data is/are normal;

S14: If the initial testing output data is/are normal, calculate a characteristic parameter of the analog-to-digital converter according to the initial testing output data;

S15: Judge whether the characteristic parameter reaches a threshold; and

S16: If the characteristic parameter reaches the threshold, the initial performance test of the analog-to-digital converter succeeds, and then moves to a next step.

In more detail, as shown in FIG. 2, step S1 of conducting the initial performance test and judgement on the analog-to-digital converter further includes:

S17: If the initial testing output data is/are abnormal, return to and repeat from the step of configuring a handshake signal;

S18: If the quantity of collection times of the initial testing output data reaches a threshold and the initial testing output data is/are still abnormal, judge the error type thereof and report an error by type, and then exit the process; and S19: If the characteristic parameter does not reach the threshold, judge the error type thereof and report an error by type, and then exit the process.

The characteristic parameter includes at least a typical characteristic parameter, such as a signal-to-noise ratio, a signal to noise and distortion ratio, and a spurious-free dynamic range, which is not limited herein. If the initial performance test of the analog-to-digital converter fails, the process exits directly, and no subsequent steps will be performed.

In detail, the analog-to-digital converter includes N conversion stages, and in step S2, the step of performing the pre-trimming and judgement on the analog-to-digital converter further includes:

S21: Extract weight errors of previous M conversion stages under a constraint of a minimum mean square error;

S22: Extract gain errors of the previous M conversion stages under the constraint of the minimum mean square error;

S23: Calibrate the analog-to-digital converter according to the weight errors and the gain errors of the previous M conversion stages;

S24: Conduct a performance test on the calibrated analog-to-digital converter and collect a testing output of the analog-to-digital converter; and S25: Judge whether the pre-trimming of the analog-to-digital converter succeeds, according to the testing output thereof;

Wherein N is an integer greater than or equal to 2, and M is an integer of 1 to N-1.

In more detail, in step S2, the pre-trimming is performed and it is judged whether the performance thereof after the trimming meets a requirement. If the requirement is met, the process continues. Otherwise, the process exits. To improve efficiency, under the constraint of the minimum mean square error, the jitter errors are usually not extracted, and only weight errors and gain errors of one or more of pre-stages of a plurality of conversion stages are extracted.

In detail, in an optional embodiment of the disclosure, as shown in FIG. 3, step S3 of performing the error extraction on the analog-to-digital converter and obtaining errors of the conversion stages thereof further includes:

S31: For each conversion stage, configure the input signal and an output mode according to a quantity of the errors that need to be tested;

S32: For each conversion stage, perform the analog-to-digital conversion by using the analog-to-digital converter according to the configured input signal and the configured output mode, collect output data of the analog-to-digital converter, and restore the output data according to a characteristic of the input signal to obtain ideal output data; and S33: For each conversion stage, extract errors of the conversion stage from a difference between the output data and the ideal output data by using an adaptive parameter extraction method.

The errors of each conversion stage include a weight error, a gain error, and a jitter error. The output modes are flexibly configured according to different output requirements regarding errors of the stages, and different data is/are output in the case of different testing requirements, so that the output interface can be shared during tests of different errors, the quantity of interfaces can be decreased and hardware overheads can be reduced. For the conversion stages, the weight error and the gain error of each conversion stage are successively extracted from a post conversion stage to a previous conversion stage. The tests are successively performed in an order from a post-stage to a pre-stage. Because the tests at different stages need to be configured with different inputs, it needs to return to step S31 after each test to re-configure the output mode and the input signal, until the tests of all errors are completed. For the conversion stages, there is no order requirement for extracting the jitter errors, but the jitter errors need to be extracted after the weight errors and the gain errors are extracted.

In more detail, in step S3, when the weight error and the gain error need to be tested and extracted, an amplitude of the input signal of each stage and a threshold voltage of comparators at each stage are configured, and output results of the comparators at each stage are sent; and when the jitter errors need to be tested and extracted, random codes and output codes corresponding to those conversion stages as needed are sent.

In detail, in an optional embodiment of the disclosure, as shown in FIG. 3, step S4 of performing the error soft trimming and test on the analog-to-digital converter according to the errors of the conversion stages further includes:

S41: Send the errors of the conversion stages to a temporary storage register of the analog-to-digital converter for storage;

S42: Calibrate the analog-to-digital converter according to the errors stored in the temporary storage register, and complete the error soft trimming of the analog-to-digital converter;

S43: Perform an analog-to-digital conversion test on the analog-to-digital converter after the error soft trimming, obtain soft trimming testing output data, and calculate a characteristic parameter of the analog-to-digital converter after the error soft trimming according to the soft trimming testing output data; and S44: Judge whether the error soft trimming thereof succeeds according to the characteristic parameter of the analog-to-digital converter after the error soft trimming.

Wherein, the error soft trimming means that a calculated error is sent to a corresponding temporary storage register of the analog-to-digital converter through an interface, so as to temporarily compensate for errors of the stages that are obtained through testing. When the performance in the soft trimming state is tested, the amplitude of the input signal needs to be restored to approach the full amplitude thereof, and typical characteristic parameters (such as a signal-to-noise ratio, a signal to noise and distortion ratio, and a spurious-free dynamic range, etc.) after the soft trimming are obtained through testing. Then, whether the performance after the soft trimming satisfies a requirement is judged. If the performance after the soft trimming does not satisfy the requirement, returns to the pre-trimming step to repeat the trimming process. If the trimming fails and the quantity of trimming times reaches a threshold, then it judges the error type, report an error by types, and exits the process.

In detail, in an optional embodiment of the disclosure, as shown in FIG. 3, step S5 of performing the error hard trimming and test on the analog-to-digital converter according to the errors of the conversion stages further includes:

S51: Write the errors of the conversion stages stored in the temporary storage register into an internal built-in memory of the analog-to-digital converter for permanent storage;

S52: Automatically read the errors stored in the internal built-in memory during each power-on, calibrate the analog-to-digital converter through the errors, and complete the error hard trimming of the analog-to-digital converter;

S53: Perform the analog-to-digital conversion test on the analog-to-digital converter after the error hard trimming, obtain hard trimming testing output data, and calculate a characteristic parameter of the analog-to-digital converter after the error hard trimming according to the hard trimming testing output data; and S54: Judge whether the error hard trimming thereof succeeds according to the characteristic parameter of the analog-to-digital converter after the error hard trimming.

Wherein, the error hard trimming means that the error value stored in the temporary storage register is written into the internal built-in memory for permanent storage. The value of the internal built-in memory is automatically read during each power-on and various errors of the converter are compensated. During the performance test after the hard trimming, each time the power-on happens, and the value of the internal built-in memory is automatically read and various errors of the analog-to-digital converter are compensated. In this case, the amplitude of the input signal needs to be configured to approach the full amplitude thereof, and the typical characteristic parameters (such as a signal-to-noise ratio, a signal to noise and distortion ratio, and a spurious-free dynamic range, etc.) after the hard trimming are obtained through testing. Then, whether the performance after the hard trimming meets a requirement is judged. If it succeeds, completion is displayed. If it does not succeed, it judges the error type, report an error by types, and then exits the process.

In conclusion, according to the method for calibrating an analog-to-digital converter provided in the disclosure, the initial performance test and judgement can be conducted to eliminate a circuit with an excessively low initial performance that is caused by a process deviation, so as to avoid a waste of resources caused when such type of circuit continues to enter subsequent testing and trimming steps but no qualified product can be formed, thereby improving test screening efficiency. The pre-trimming step is additionally performed to roughly pre-estimate the final trimming performance, and the feasibility of the trimming is evaluated to form a second-time screening, so as to avoid a waste of resources caused when a circuit with an excessively large deviation enter the subsequent testing and trimming steps while no qualified product can be obtained, thereby further improving the test screening efficiency. According to different input and output requirements of errors of the stages, the input signals, the threshold voltages of comparators, and the output modes are flexibly configured to implement multi-stage and multi-error extraction of the analog-to-digital converter. According to different input and output requirements of errors of the stages, the output modes are flexibly configured, and different data are output in cases of different testing requirements, so that the output interface can be shared during tests of different errors, thereby reducing the quantity of interfaces and hardware overheads. The soft trimming is performed to confirm a trimming effect, and then the hard trimming is performed to solidify error compensation information thereof, thereby avoiding a trimming mistake and increasing a trimming yield rate. By using the adaptive parameter extraction method, the quantity of samples needed is small, thereby greatly reducing a calculation amount of parameter extraction and improving the efficiency of testing and calibration. As a whole, the calibration method is a digital calibration method, and achieves a higher precision of error calibration than an analog calibration method.

The foregoing embodiments merely illustrate principles and functions of the disclosure, but are not intended to limit the disclosure. Any person skilled in the art may modify or alter the foregoing embodiments without departing from the spirit and scope of the disclosure. Therefore, all equivalent modifications or alterations completed by a person of ordinary skill in the art without departing from the spirit and technical ideas disclosed in the disclosure shall still be covered by the claims of the disclosure.

What is claimed is:

1. A method for calibrating an analog-to-digital converter, comprising the following steps:
   conducting an initial performance test and judgement on an analog-to-digital converter;
   if the initial performance test of the analog-to-digital converter succeeds, performing a pre-trimming and judgement on the analog-to-digital converter;
   if the pre-trimming of the analog-to-digital converter succeeds, performing an error extraction on the analog-to-digital converter and obtain errors of conversion stages thereof;
   performing an error soft trimming and test on the analog-to-digital converter according to the errors of the conversion stages; and
   if the error soft trimming and test of the analog-to-digital converter succeed, performing an error hard trimming and test on the analog-to-digital converter according to the errors of the conversion stages;
   wherein the step of performing the initial performance test and judgement on the analog-to-digital converter comprises:
   configuring a handshake signal;
   conducting an initial performance test on the analog-to-digital converter and collect initial testing output data of the analog-to-digital converter;
   judging whether the initial testing output data is/are normal;
   if the initial testing output data is/are normal, calculating a characteristic parameter of the analog-to-digital converter according to the initial testing output data; and
   judging whether the characteristic parameter reaches a threshold, wherein if the characteristic parameter reaches the threshold, the initial performance test of the analog-to-digital converter succeeds;
   wherein the analog-to-digital converter comprises N conversion stages, and the step of performing the pre-trimming and judgement on the analog-to-digital converter comprises:
   extracting weight errors of previous M conversion stages under a constraint of a minimum mean square error;
   extracting gain errors of the previous M conversion stages under the constraint of the minimum mean square error;
   calibrating the analog-to-digital converter according to the weight errors and the gain errors of the previous M conversion stages;
   conducting a performance test on the calibrated analog-to-digital converter and collect a testing output of the analog-to-digital converter; and
   judging whether the pre-trimming of the analog-to-digital converter succeeds according to the testing output thereof, wherein N is an integer greater than or equal to 2, and M is an integer of 1 to N-1;
wherein the step of performing the error extraction on the analog-to-digital converter and obtain errors of the conversion stages of the analog-to-digital converter comprises:
for each conversion stage, configuring the input signal and an output mode according to a quantity of errors that need to be tested;
for each conversion stage, performing an analog-to-digital conversion by using the analog-to-digital converter according to the configured input signal and the configured output mode, collecting output data of the analog-to-digital converter, restoring the output data according to a characteristic of the input signal, and obtaining ideal output data; and
for each conversion stage, extracting errors of the conversion stage from a difference between the output data and the ideal output data by using an adaptive parameter extraction method;
wherein the step of performing the error soft trimming and test on the analog-to-digital converter according to the errors of the conversion stages comprises:
sending the errors of the conversion stages to a temporary storage register of the analog-to-digital converter for storage;
calibrating the analog-to-digital converter according to the errors stored in the temporary storage register, and complete the error soft trimming of the analog-to-digital converter;
performing an analog-to-digital conversion test on the analog-to-digital converter after the error soft trimming, obtaining soft trimming testing output data, and calculating a characteristic parameter of the analog-to-digital converter after the error soft trimming according to the soft trimming testing output data; and
judging whether the error soft trimming of the analog-to-digital converter succeeds according to the characteristic parameter thereof after the error soft trimming;
wherein the step of performing the error hard trimming and test on the analog-to-digital converter according to the errors of the conversion stages comprises:
writing the errors of the conversion stages stored in the temporary storage register into an internal built-in memory of the analog-to-digital converter for permanent storage;
automatically reading the errors stored in the internal built-in memory during each power-on, calibrating the analog-to-digital converter through the errors, and completing the error hard trimming thereof;
performing an analog-to-digital conversion test on the analog-to-digital converter after the error hard trimming, obtaining hard trimming testing output data, and calculating a characteristic parameter of the analog-to-digital converter after the error hard trimming according to the hard trimming testing output data; and
judging whether the error hard trimming of the analog-to-digital converter succeeds according to the characteristic parameter thereof after the error hard trimming.

2. The method for calibrating an analog-to-digital converter according to claim 1, wherein before the performing initial performance test and judgement on the analog-to-digital converter, the method for calibrating the analog-to-digital converter further comprises:
configuring an input signal according to an input range of the analog-to-digital converter.

3. The method for calibrating an analog-to-digital converter according to claim 2, wherein a maximum value of the input signal is greater than a maximum comparator threshold in the analog-to-digital converter, and a minimum value of the input signal is less than a minimum comparator threshold in the analog-to-digital converter.

4. The method for calibrating an analog-to-digital converter according to claim 1, wherein the errors comprise a weight error, a gain error, and a jitter error; and for the conversion stages, the weight error and the gain error of each conversion stage are successively extracted from a post conversion stage of the conversion stages to a previous conversion stage thereof.

5. The method for calibrating an analog-to-digital converter according to claim 4, wherein for the conversion stages, there is no order requirement for extracting the jitter errors, but the jitter errors are extracted after the weight errors and the gain errors are extracted.

6. The method for calibrating an analog-to-digital converter according to claim 4, wherein when the weight error and the gain error need to be tested and extracted, an amplitude of the input signal of each stage and a threshold voltage of comparators at each stage are configured, and output results of the comparators at each stage are sent; and when the jitter errors need to be tested and extracted, random codes and output codes of the correspondingly needed conversion stages are sent.

* * * * *